(12) United States Patent
Naitou et al.

(10) Patent No.: US 7,212,700 B2
(45) Date of Patent: May 1, 2007

(54) ELECTRO-OPTIC HYBRID CIRCUIT BOARD

(75) Inventors: Ryuusuke Naitou, Osaka (JP);
Hideyuki Usui, Osaka (JP); Amane Mochizuki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/258,108

(22) Filed: Oct. 26, 2005

(65) Prior Publication Data

US 2006/0086533 A1    Apr. 27, 2006

(30) Foreign Application Priority Data

Oct. 27, 2004  (JP)  ............. P.2004-312096
Dec. 6, 2004   (JP)  ............. P.2004-352545

(51) Int. Cl.
*G02B 6/12*   (2006.01)
*G02F 1/035*  (2006.01)
*G02F 1/295*  (2006.01)

(52) U.S. Cl. ............ 385/14; 385/2; 385/3; 385/8; 385/9; 385/10

(58) Field of Classification Search ............ 385/2, 385/8–10, 14, 3
See application file for complete search history.

(56) References Cited

U.S. PATENT DOCUMENTS 6,741,762 B2 *  5/2004  Grinberg et al. ............ 385/2

FOREIGN PATENT DOCUMENTS

JP    2001-166165 A    6/2001

* cited by examiner

*Primary Examiner*—Brian Healy
*Assistant Examiner*—Jerry Martin Blevins
(74) *Attorney, Agent, or Firm*—Sughrue Mion, PLLC

(57) ABSTRACT

The invention provides an electro-optic hybrid circuit board having an optical waveguide superposed on a wiring circuit board, the electro-optic hybrid circuit board comprising: an insulating layer; a conductor pattern formed on the insulating layer; an undercladding layer formed on the conductor pattern-having insulating layer so as to surround the conductor pattern; a core layer formed on the undercladding layer; and an overcladding layer formed to cover the core layer and the undercladding layer.

3 Claims, 2 Drawing Sheets

ELECTRO-OPTIC HYBRID CIRCUIT BOARD

FIELD OF THE INVENTION

The present invention relates to an electro-optic hybrid circuit board comprising a wiring circuit board part and an optical waveguide part.

BACKGROUND OF THE INVENTION

In the recent information communication technology, optical signals and electrical signals are mutually converted in conducting information communication. In such information communication, an electro-optic hybrid circuit board having both a wiring circuit board for transmitting electrical signals and an optical waveguide for transmitting light is used. For example, the electro-optic hybrid circuit board described in patent document 1 comprises a wiring circuit board and an optical waveguide, superposed one on the other through an adhesive layer.

Patent Document 1: JP 2001-166165 A

In high-density information communication, there is a desire for communication apparatus to have reduced size and thickness. Hence, electro-optic hybrid circuit boards are also required to have a smaller thickness.

SUMMARY OF THE INVENTION

Accordingly, an object of the invention is to provide an electro-optic hybrid circuit board which is thinner than the related-art electro-optic hybrid circuit boards.

Other objects and effects of the invention will be apparent from the following description.

In order to accomplish the objects, the invention provides an electro-optic hybrid circuit board having an optical waveguide superposed on a wiring circuit board, the electro-optic hybrid circuit board comprising:

an insulating layer;

a conductor pattern formed on the insulating layer;

an undercladding layer formed on the conductor pattern-having insulating layer so as to surround the conductor layer;

a core layer formed on the undercladding layer; and an overcladding layer formed to cover the core layer and the undercladding layer.

In the electro-optic hybrid circuit board of the invention, the undercladding layer of the optical waveguide functions also as an insulating cover layer for the wiring circuit board. Because of this, compared to the related-art electro-optic hybrid circuit board in which the optical waveguide and the wiring circuit board are superposed one on the other through an adhesive layer, the hybrid circuit board of the invention can have an overall thickness reduced by the thickness corresponding to the sum of the adhesive layer and the insulating cover layer of the wiring circuit board.

BRIEF DESCRIPTION OF THE DRAWINGS

FIG. 2(a) shows a step of forming a wiring circuit board part; FIG. 2(b) shows a step of forming an undercladding layer on the wiring circuit board part; FIG. 2(c) shows a step of forming a core layer on the undercladding layer; and FIG. 2(d) shows a step of forming an overcladding layer over the core layer.

Figure 1:
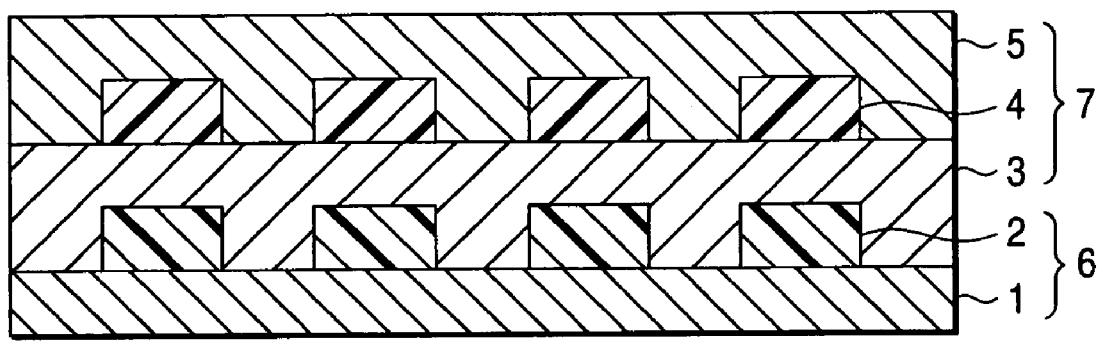
FIG. 1 is a sectional view illustrating an main part of one embodiment of the electro-optic hybrid circuit board of the invention.

The reference numerals used in the drawings denote the followings, respectively.

1: Insulating layer
2: Conductor pattern
3: Undercladding layer
4: Core layer
5: Overcladding layer
6: Wiring circuit board part
7: Optical waveguide part

DETAILED DESCRIPTION OF THE INVENTION

The electro-optic hybrid circuit board of the invention comprises a wiring circuit board and an optical waveguide superposed thereon. As shown in FIG. 1, it comprises a wiring circuit board part 6 and an optical waveguide part 7, and the undercladding layer 3 of the optical waveguide functions also as an insulating cover layer for the wiring circuit board.

The wiring circuit board part 6 and the optical waveguide part 7 will be explained below in order.

First, the wiring circuit board part 6 is explained by reference to FIG. 1.

The material to be used for forming the insulating layer 1 of the wiring circuit board part 6 is not particularly limited as long as it has insulating properties. Examples thereof include, for example, synthetic resins such as polyimide resins, poly(amide-imide) resins, acrylic resins, polyether nitrile resins, polyethersulfone resins, poly(ethylene terephthalate) resins, poly(ethylene naphthalate) resins, poly(vinyl chloride) resins, epoxy resins, and polyurethane resins. From the standpoint of heat resistance, it is preferred to use a polyimide resin.

The thickness of the insulating layer 1 is preferably 5 to 50 μm.

A conductor pattern 2 having a predetermined shape is formed on the insulating layer 1. The material to be used for forming the conductor pattern 2 is not particularly limited as long as it has electrical conductivity. Examples thereof include, for example, metals such as copper, chromium, nickel, aluminum, stainless steel, copper-beryllium, phosphor bronze, iron-nickel, and alloys of these. Preferably, copper is used.

The conductor pattern 2 preferably has a line width of 5 to 50 μm, and the spacing between the lines is preferably 5 to 50 μm. The thickness of the conductor pattern 2 is preferably 3 to 50 μm.

Next, the optical waveguide part 7 is explained by reference to FIG. 1.

An undercladding layer 3 is formed over the conductor pattern 2 of the wiring circuit board part 6. The material to be used for forming the undercladding layer 3 is not particularly limited as long as it has transparency. Examples thereof include, for example, synthetic resins such as epoxy resins, poly(amic acid) resins, and polyimide resins.

The thickness of the undercladding layer 3 is preferably 5 to 100 μm.

A core layer 4 having a predetermined pattern is formed on the undercladding layer 3. The material to be used for forming the core layer 4 is not particularly limited as long as it has transparency. Examples thereof include, for example, epoxy resins, poly(amic acid) resins, polyimide resins, and the like. Usually, the core layer 4 is designed to have a higher refractive index than the undercladding layer 3 and the overcladding layer 5 which will be described below.

The pattern of the core layer 4 preferably has a line width of 5 to 100 μm, and the spacing between the lines is preferably 5 to 500 μm. The thickness of the core layer 4 is preferably 5 to 100 μm.

An overcladding layer 5 is formed over the core layer 4. The material to be used for forming the overcladding layer 5 is not particularly limited as long as it has transparency. Examples thereof include, for example, epoxy resins, poly (amic acid) resins, and polyimide resins. Usually, the same material as that used for the undercladding layer 3 is used.

The thickness of the overcladding layer 5 is preferably 5 to 100 μm.

The overall thickness of the electro-optic hybrid circuit board of the invention is preferably 15 to 250 μm.

Figure 2:
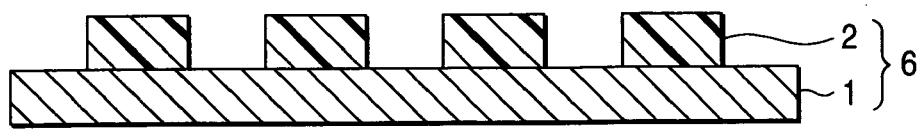
FIGS. 2(a) to 2(d) are sectional views showing steps in a process for producing the electro-optic hybrid circuit board shown in FIG. 1.
Figure 2:
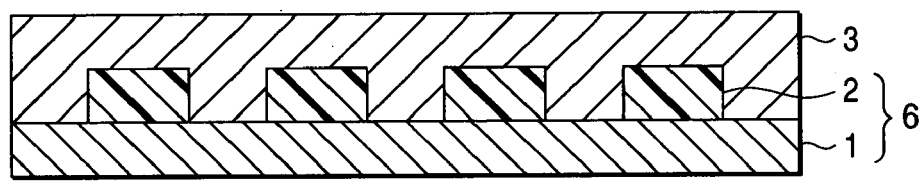
Figure 2:
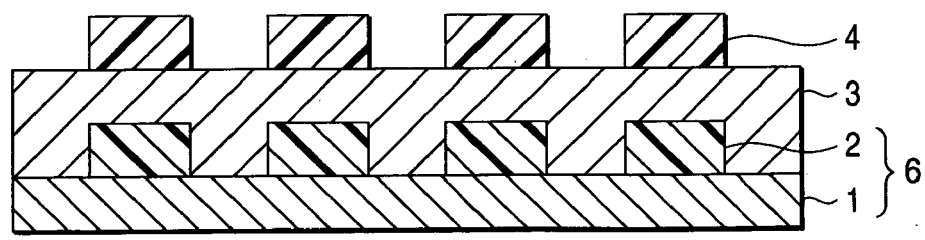
Figure 2:
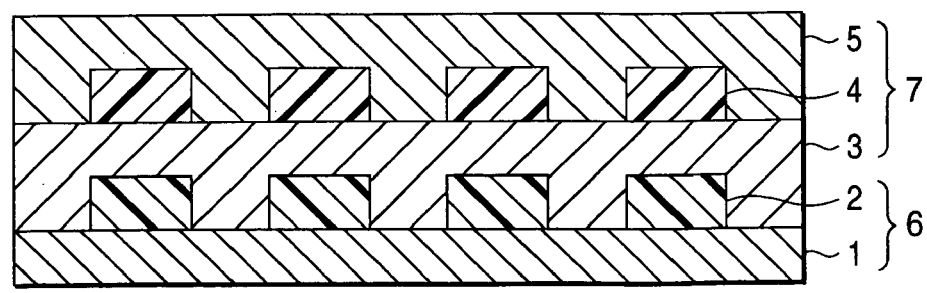

Next, a process for producing the electro-optic hybrid circuit board of the invention will be explained by reference to FIGS. 2.

In producing the electro-optic hybrid circuit board of the invention, a wiring circuit board part 6 is formed first. An optical waveguide part 7 is then formed thereon so as to overlie the part 6 to thereby produce a hybrid circuit board.

Methods for forming the wiring circuit board part 6 and optical waveguide part 7 will be explained below in order.

First, a conductor pattern 2 having a predetermined shape is formed on an insulating layer 1 as shown in FIG. 2(a). For forming the conductor pattern 2, a known method such as, e.g., the subtractive method, semi-additive method, or additive method can be used.

The subtractive method is a technique in which a conductor layer is formed on the whole surface of an insulating layer and unnecessary parts of the conductor layer are removed by etching to thereby form a conductor pattern having a predetermined shape. The semi-additive method and the additive method are a technique in which a conductor pattern having a predetermined shape is formed by plating, etc.

In accordance with the above-described method, a wiring circuit board part 6 is formed.

Subsequently, as shown in FIG. 2(b), an undercladding layer 3 is formed over the conductor pattern 2. The undercladding layer 3 can be formed by a method in which a solution prepared by dissolving a synthetic resin for forming the undercladding layer 3 in a solvent is applied and dried.

The resin concentration of the solution is preferably 50 to 90% by weight from the standpoint of forming the undercladding layer 3 with a smooth surface.

A core layer 4 having a predetermined pattern is then formed on the undercladding layer 3 as shown in FIG. 2(c). Methods for forming the core layer 4 are not particularly limited. For example, a photosensitive resin can be used to form the layer 4. Preferred examples of the photosensitive resin include photosensitive epoxy resins, photosensitive poly(amic acid) resins, and photosensitive polyimide resins.

Subsequently, an overcladding layer 5 is formed over the core layer 4 as shown in FIG. 2(d). This overcladding layer 5 can be formed in the same manner as for the undercladding layer 3.

Thus, the electro-optic hybrid circuit board of the invention can be obtained which comprises the wiring circuit board part 6 and the optical waveguide part 7 formed thereon.

EXAMPLES

The present invention will be illustrated in greater detail with reference to the following Example, but the invention should not be construed as being limited thereto.

Example 1

A conductor pattern was formed on an insulating layer comprising a polyimide film having a thickness of 25 μm by the semi-additive method to produce a wiring circuit board part (see FIG. 2(a)).

In the semi-additive method, a thin metal film was first formed on the insulating layer by successively depositing a thin chromium layer having a thickness of 0.01 μm and a thin copper layer having a thickness of 0.15 μm by sputtering. Thereafter, a plating resist was formed so as to have the pattern which was reverse to the conductor pattern to be formed. Copper electroplating was then conducted to form a metallic wiring made of 20 μm-thick copper as the conductor pattern, which had a metallic-wiring line width of 25 μm with a spacing between metallic-wiring lines being 25 μm. Thereafter, the plating resist was stripped off, and the thin metal film uncovered by the conductor pattern was removed by wet etching.

Subsequently, an optical waveguide part was formed in the following manner on the wiring circuit board part obtained above.

First, according to the formulations shown in Table 1, the ingredients were mixed together and dissolved using cyclohexanone as a solvent. Thus, varnishes A and B were prepared. For each varnish, the refractive index of a cured resin obtained by curing the varnish, as measured at a wavelength of 633 nm, is also shown in Table 1.

TABLE 1

| | (parts by weight) | |
|---|---|---|
| Varnish | A | B |
| Fluorene derivative 1 | 83 | 67 |
| Fluorene derivative 2 | — | 33 |
| Diluent | 17 | — |
| Photo-acid generator | 1 | 1 |
| Refractive index of cured resin (measuring wavelength, 633 nm) | 1.585 | 1.615 |

Fluorene derivative 1: bisphenoxyethanolfluorene diglycidyl ether (represented by general formula (1) wherein $R_1$ to $R_6$ each are a hydrogen atom and n is 1)

Fluorene derivative 2: bisphenolfluorene diglycidyl ether (represented by general formula (1) wherein $R_1$ to $R_6$ each are a hydrogen atom and n is 0)

Diluent: 3,4-epoxycyclohexenylmethyl 3',4'-epoxycyclohexenecarboxylate (Celoxide 2021P, manufactured by Daicel Chemical Industries, Ltd.)

Photo-acid generator: 50% propylene carbonate solution of 4,4-bis[di(β-hydroxyethoxy)phenylsulfinio]phenyl sulfide bishexafluoroantimonate

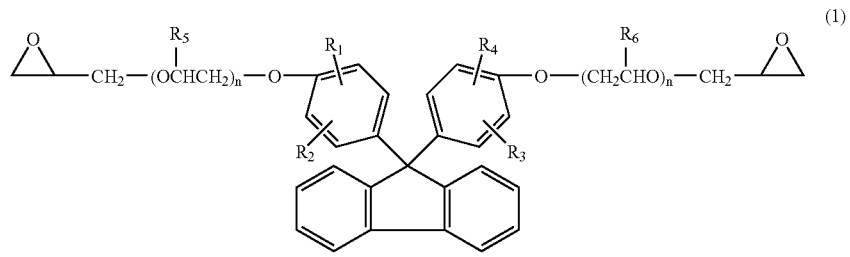

(1)

Varnish A was applied on the conductor pattern side of the wiring circuit board part by spin coating and dried at 90° C. for 15 minutes to form a resin layer. Thereafter, the resin layer was wholly irradiated with ultraviolet in an exposure dose of 2,000 mJ/cm$^2$ and then heated at 100° C. for 30 minutes to form an undercladding layer having a smooth surface and a thickness of 30 μm (see FIG. 2(b)).

Subsequently, varnish B was applied on the undercladding layer by spin coating and dried at 90° C. for 15 minutes to form a resin layer. Through a photomask having a linear optical-waveguide pattern with a line width of 50 μm (chrome mask based on synthetic quartz), the resin layer was then irradiated with ultraviolet by the contact exposure method in an exposure dose of 2,000 mJ/cm$^2$.

Thereafter, post-exposure heating was conducted at 90° C. for 60 minutes. The resultant structure was immersed in an acetonitrile-based developing liquid. The resin layer was thus developed to impart a pattern thereto. Thereafter, the resin layer was heated at 100° C. for 30 minutes. Thus, a core layer having a square section with a thickness of 50 μm and a width of 50 μm was formed with a spacing of 250 μm (see FIG. 2(c)).

Varnish A was applied by spin coating on the undercladding layer and the core layer and dried at 90° C. for 15 minutes to form a resin layer. Thereafter, the resin layer was wholly irradiated with ultraviolet in an exposure dose of 2,000 mJ/cm$^2$ and then heated at 100° C. for 30 minutes to form an overcladding layer having a thickness of 80 μm (see FIG. 2(d)). Thus, a multimode optical waveguide part having a specific refractive-index difference Δ of 1.8% was obtained.

By the procedure described above, an electro-optic hybrid circuit board as shown in FIG. 1 was produced.

The overall thickness of the electro-optic hybrid circuit board obtained was 135 μm.

While the present invention has been described in detail and with reference to specific embodiments thereof, it will be apparent to one skilled in the art that various changes and modifications can be made therein without departing from the spirit and scope thereof.

The present application is based on Japanese Patent Application No. 2004-352545 filed Dec. 6, 2004, the contents thereof being herein incorporated by reference.

What is claimed is:

1. An electro-optic hybrid circuit board having an optical waveguide superposed on a wiring circuit board,
    the electro-optic hybrid circuit board comprising:
    an insulating layer;
    a conductor pattern formed on the insulating layer;
    an undercladding layer formed on the conductor pattern-having insulating layer so as to surround the conductor pattern;
    a core layer formed on the undercladding layer; and
    an overcladding layer formed to cover the core layer and the undercladding layer,
    wherein the conductor pattern has a predetermined shape and the conductor pattern has a line width of 5 to 50 μm, and spacing between the lines of 5 to 50 μm.

2. The electro-optic hybrid circuit board of claim 1, having a total thickness of 15 to 250 μm.

3. The electro-optic hybrid circuit board of claim 1, wherein the conductor pattern has a thickness of 3 to 50 μm.

* * * * *